United States Patent [19]

Tamamura et al.

[11] Patent Number: 5,780,322
[45] Date of Patent: Jul. 14, 1998

[54] METHOD FOR GROWING A II-VI COMPOUND SEMICONDUCTOR LAYER CONTAINING CADMIUM AND METHOD FOR FABRICATING A SEMICONDUCTOR LASER

[75] Inventors: Koshi Tamamura, Tokyo; Hironori Tsukamoto; Masao Ikeda, both of Kanagawa, all of Japan

[73] Assignee: Sony Corporation, Tokyo, Japan

[21] Appl. No.: 722,615

[22] Filed: Sep. 27, 1996

[30] Foreign Application Priority Data

Sep. 29, 1995 [JP] Japan .................. 7-276859

[51] Int. Cl.$^6$ .................................. H01L 21/20
[52] U.S. Cl. .................. 438/45; 438/46; 438/930; 438/603
[58] Field of Search ............... 437/129, 107, 437/132; 148/DIG. 64; 438/45, 46, 930, 603

[56] References Cited

U.S. PATENT DOCUMENTS 4,743,310  5/1988  Kay et al. ............. 148/DIG. 64
4,960,728  10/1990  Schaake et al. ......... 148/DIG. 64
5,366,927  11/1994  Schetzina ............... 438/603
5,398,641  3/1995  Shih ..................... 148/DIG. 64

OTHER PUBLICATIONS

T. Yao, "MBE of II-VI Compounds", in The Technology and Physics of Molecular Beam Epitaxy, edited by E.H.C. Parker, Plenum Press, pp. 313–343, Sep. 1985.

*Primary Examiner*—Charles L. Bowers, Jr.
*Assistant Examiner*—Keith Christianson
*Attorney, Agent, or Firm*—Hill & Simpson

[57] ABSTRACT

A method for growing a II-VI compound semiconductor layer containing Cd, such as $Zn_{1-x}Cd_xSe$, by a molecular beam epitaxy method is disclosed. During the growth, the ratio of the intensity of molecular beams of a group VI element to the intensity of molecular beams of a group II element in terms of intensities of molecular beams actually irradiated onto a substrate, namely, the substantial VI/II ratio, is controlled preferably in the range from 0.7 to 1.3, to increase the Cd incorporating efficiency into the grown layer sufficiently high.

12 Claims, 6 Drawing Sheets

METHOD FOR GROWING A II-VI COMPOUND SEMICONDUCTOR LAYER CONTAINING CADMIUM AND METHOD FOR FABRICATING A SEMICONDUCTOR LASER

BACKGROUND OF THE INVENTION

1. Field of the Invention

This invention relates to a method for growing a II-VI compound semiconductor layer containing cadmium (Cd) and a method for fabricating a semiconductor laser comprising the II-VI compound semiconductor layer containing Cd.

2. Description of the Related Art

ZnSe-based II-VI compound semiconductors are used to make semiconductor lasers capable of emitting blue to green light, light emitting diodes and other semiconductor light emitting devices. As already known, when a ZnCdSe layer is used as the active layer behaving as a light emitting portion in a semiconductor light emitting device of this type, it promises effective carrier confinement and optical confinement, and hence greatly improves the characteristics of the device.

Among various semiconductor light emitting devices using a ZnCdSe layer as the active layer, semiconductor lasers, in particular, can be designed for any desired wavelengths of oscillation by selecting the composition ratio of Cd in the ZnCdSe layer. For example, with a semiconductor laser whose active layer is approximately 7.5 nm thick and contains 20% of Cd, continuous oscillation of the wavelength of 510 nm was confirmed at room temperature.

Conventional growth of a II-VI compound semiconductor layer forming the semiconductor laser have relied solely on molecular beam epitaxy (MBE). The MBE method evaporates material elements for a desired II-VI compound semiconductor layer in an ultrahigh vacuum to generate molecular beams, and irradiates a substrate with the molecular beams to grow the desired II-VI compound semiconductor layer. Especially when a ZnCdSe layer is grown by using Zn molecular beams, Cd molecular beams and Se molecular beams, the Cd composition of the grown layer increases with an increase in intensity of the Cd molecular beams relative to the Zn molecular beams and the Se molecular beams.

The crystallographic property of a II-VI compound semiconductor layer grown by the MBE method greatly varies with the ratio of the intensity of molecular beams of a group VI element to the intensity of molecular beams of a group II element (hereinbelow called VI/II ratio) during the growth. Therefore, the VI/II ratio must be one of important factors of the growth. For example, the ratio of the intensity of Se molecular beams to the intensity of Zn molecular beams is important for growth of ZnSe.

Adjustment of the amount of Cd supplied during the growth of a ZnCdSe layer has been effected by adjusting the intensity of Cd molecular beams as referred to above. However, without an optimum VI/II ratio being found, which promises a good crystallographic property, conventional methods have not realized a ZnCdSe layer with a good crystallographic property.

This is a problem not only with ZnCdSe layers but rather with all II-VI compound semiconductor layers containing Cd.

OBJECTS AND SUMMARY OF THE INVENTION

It is therefore an object of the invention to provide a method for growing a II-VI compound semiconductor layer containing cadmium which can promise a good crystallographic property by optimizing the ratio of the substantial or actual irradiated intensity of molecular beams of a group VI element to the substantial intensity of molecular beams of a group II element.

Another object of the invention is to provide a method for fabricating a semiconductor laser using such a method for growing a II-VI compound semiconductor layer containing cadmium.

To attain the object, the Inventor made studies for optimizing the ratio of the intensity of molecular beams of a group VI element to the intensity of molecular beams of a group II element, i.e. the VI/II ratio, during growth of ZnCdSe layers and other II-VI compound semiconductor layers containing Cd. As a result, the Inventor found that the Cd incorporating efficiency into the grown layer is maximum (for example, 100%) when the ratio of the intensity of molecular beams of a group VI element to the intensity of molecular beams of a group II element in terms of substantial intensities of molecular beams actually irradiating a substrate, i.e. the ratio of the substantial intensity of molecular beams of a group VI element to the substantial intensity of molecular beams of a group II element (hereinbelow called substantial VI/II ratio) is 1 and that the Cd incorporating efficiency is sufficiently high (for example, 90% or more) even with other near values of the substantial VI/II ratio, specifically, in the range from 0.7 to 1.3. According to the result of photoluminescence observation which is useful for evaluating the optical quality of the grown layer, the layer grown with the substantial VI/II ratio around 1 had a substantially large photoluminescent intensity, which means a good crystallographic property of the layer. Further, the II-VI compound semiconductor layer containing Cd grown in this manner has both a (2×1) structure and a c(2×2) structure. The letter "c" of c(2×2) means that the structure is a face-centered surface net.

The present invention relies upon the above knowledge of the Inventor.

According to an aspect of the invention, there is provided a method for growing a II-VI compound semiconductor layer containing cadmium by a molecular beam epitaxy method, comprising:

setting the ratio of the substantial intensity of molecular beams of a group VI element to the substantial intensity of molecular beams of a group II element in the range from 0.7 to 1.3 during the growth.

According to another aspect of the invention, there is provided a method for fabricating a semiconductor laser comprising a II-VI compound semiconductor layer containing cadmium in which the II-VI compound semiconductor layer containing cadmium is grown by using a molecular beam epitaxy method, comprising:

setting the ratio of the substantial intensity of molecular beams of a group VI element to the substantial intensity of molecular beams of a group II element in the range from 0.7 to 1.3.

In the invention, the ratio of the substantial intensity of molecular beams of a group VI element to the substantial intensity of molecular beams of a group II element, i.e. the substantial VI/II ratio, is preferably in the range of 0.8 to 1.2.

In a preferred embodiment of the invention, the ratio of the substantial intensity of molecular beams of a group VI element to the substantial intensity of molecular beams of a group II element, i.e. the substantial VI/II ratio, is preferably about 1.

In the invention, the II-VI compound semiconductor layer containing cadmium is typically (100)-oriented.

The II-VI compound semiconductor layer containing cadmium contains one or more group II elements selected from the group consisting of group II elements other than cadmium, which are, specifically, zinc (Zn), magnesium (Mg), mercury (Hg) and beryllium (Be), and one or more group VI elements selected from the group consisting of selenium (se), sulfur (S) and tellurium (Te). Typical examples of II-VI compound semiconductor layers containing cadmium are ZnCdSe layer, ZnCdS layer, CdMgSe layer, ZnCdSSe layer, and so on.

According to the above-featured invention, since a II-VI compound semiconductor layer containing cadmium is grown by a molecular epitaxy method while the ratio of the substantial intensity of molecular beams of a group VI element to the substantial intensity of molecular beams of a group II element, i.e. the substantial VI/II ratio, is set in the range of 0.7 to 1.3, the cadmium incorporating efficiency into the grown layer is made sufficiently high, e.g. from 90% to 100%, which enables optimization of the cadmium incorporating efficiency into the grown layer. Accordingly, a high quality of the II-VI compound semiconductor layer containing cadmium can be realized. The surface rearranged structure of the II-VI compound semiconductor layer includes both a (2×1) structure and a c(2×2) structure.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

An embodiment of the invention is described below with reference to the drawings.

Prior to describing an embodiment of the invention, an explanation is made on results of a measurement concerning the relation between the VI/II ratio during growth of a ZnCdSe layer by a MBE method and the Cd incorporating efficiency into the grown layer.

Figure 1:
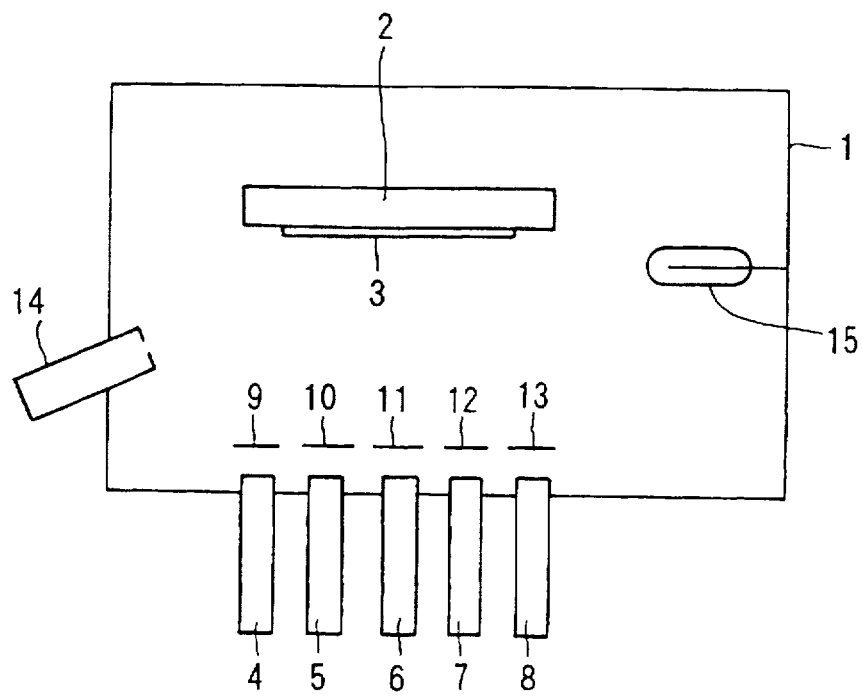
FIG. 1 is a schematic view of a MBE apparatus used for growing a II-VI compound semiconductor layer.

FIG. 1 shows a MBE apparatus used for growing II-VI compound semiconductors.

As shown in FIG. 1, the MBE apparatus has a substrate holder 2, which is located in a ultrahigh vacuum-evacuated substrate 3 on which a desired layer is to be grown. The substrate holder 2 may be a molybdenum block, for are filled with, respectively, Zn, Cd, Se, S and $ZnCl_2$, for example. Shutters 9 to 13 are provided at inner ends of the cells 4 to 8. The growth chamber 1 also has a plasma cell 14 utilizing electron cyclotron resonance (ECR) or radio frequency. Numeral 15 denotes an ion gauge (beam monitor) for monitoring intensities of the molecular beams. The ion gauge 15 is movable within the growth chamber.

Figure 2:
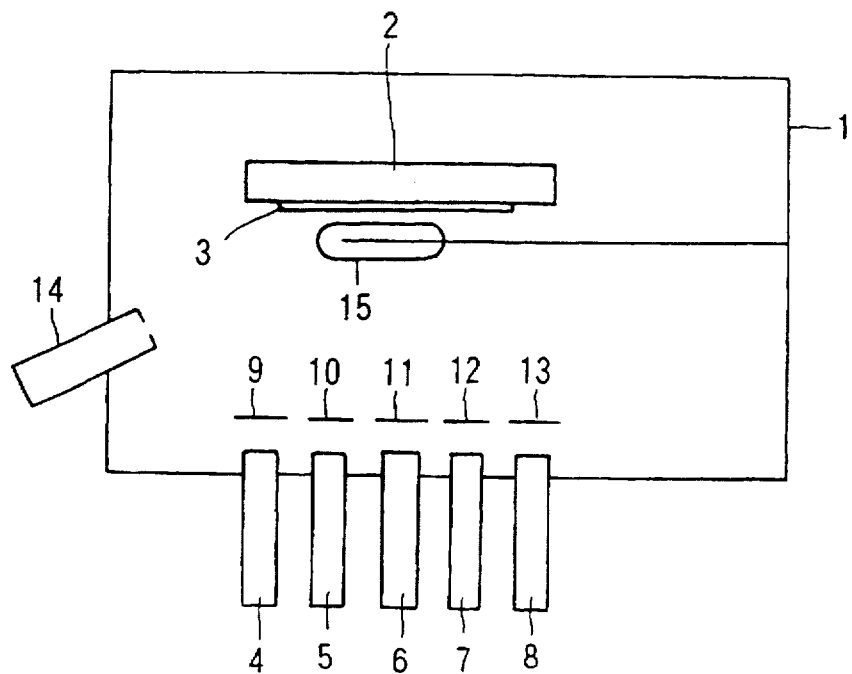
FIG. 2 is a schematic view of a MBE apparatus used for growing a II-VI compound semiconductor.

Measurement of intensities of the molecular beams in the MBE apparatus is done in the following manner. The cells 4 to 8 closed by the shutters 9 to 13 and are heated by heaters (not shown) to predetermined temperatures to generate the molecular beams. After that, as shown in FIG. 2, the ion gauge 15 is moved toward and near the substrate 3. Then, while the shutters 9 to 13 are opened sequentially, intensities of the molecular beams generated from the cells 4 to 8 are measured in terms of pressures by the ion gauge 15.

Figure 3:
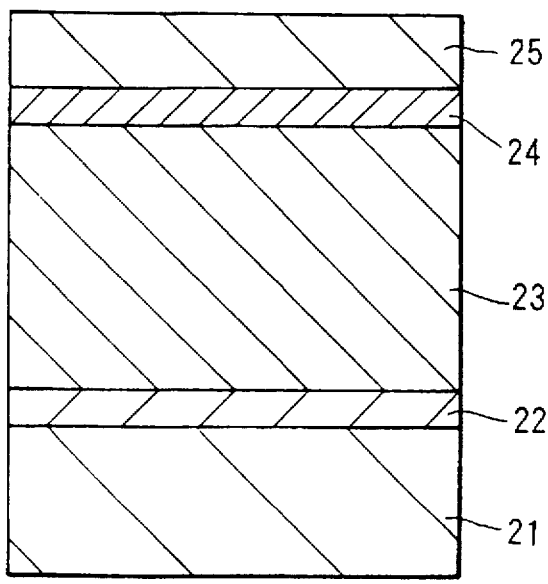
FIG. 3 is a cross-sectional view of a semiconductor light emitting device fabricated in form of a simplified structure by using the MBE apparatus of FIG. 1.

By using the MBE apparatus having the above-described construction, the semiconductor light emitting device having the simplified structure as shown in FIG. 3 was made.

In greater detail, as shown in FIG. 3, a semiconductor light emitting device was made by sequentially depositing on a (100)-oriented n-type GaAs substrate 21 an n-type ZnSe buffer layer 22, an n-type $ZnS_ySe_{1-y}$ waveguide layer 23, a $Zn_{1-x}Cd_xSe$ active layer 24 and a p-type $ZnS_ySe_{1-y}$ waveguide layer 25. The n-type ZnSe buffer layer 22 and the n-type $ZnS_ySe_{1-y}$ waveguide layer 23 were doped with chlorine (Cl) as a donor impurity. The p-type $ZnS_ySe_{1-y}$ waveguide layer 25 was doped with nitrogen (N) as an acceptor impurity. The n-type ZnSe buffer layer 22 was 20 nm thick, the n-type $ZnS_ySe_{1-y}$ waveguide layer was 1 μm thick, the $Zn_{1-x}Cd_xSe$ active layer 24 was 7 nm thick, and the p-type $ZnS_ySe_{1-y}$ waveguide layer 25 was 100 nm thick. The temperature $T_g$ for growing these layers was 307° C.

For the growth of the n-type ZnSe buffer layer 22, Zn molecular beams generated from the cell 4, Se molecular beams generated from the cell 6 and $ZnCl_2$ molecular beams generated from the cell 8 were irradiated. For the growth of the n-type $ZnS_ySe_{1-y}$ waveguide layer 23, Zn molecular beams generated from the cell 4, Se molecular beams generated from the cell 6, S molecular beams generated from the cell 7 and $ZnCl_2$ molecular beams generated from the cell 8 were irradiated. For the growth of the $Zn_{1-x}Cd_xSe$ active layer 24, Zn molecular beams generated from the cell 4, Cd molecular beams generated from the cell 5 and Se molecular beams generated from the cell 6 were irradiated. For the growth of the p-type $ZnS_ySe_{1-y}$ waveguide layer 25, in addition to irradiation of Zn molecular beams generated from the cell 4, Se molecular beams generated from the cell 6 and S molecular beams generated from the cell 7, $N_2$ plasma generated from the plasma cell 14 was irradiated.

Some semiconductor light emitting devices as shown in FIG. 3 were made, varying the VI/II ratio during the growth of the $Zn_{1-x}Cd_xSe$ active layer 24. PL measurement was done with these semiconductor light emitting devices transferred from the growth chamber 1 of the MBE apparatus to a photoluminescence (PL) measurement apparatus. Although the temperature for the PL measurement may be at room temperature, a low temperature, namely, the liquid helium temperature (4.2 K), was used for better resolution of peaks of respective spectra and hence for enabling identification. The temperature may also be the liquid nitrogen temperature (77 K) in lieu of the liquid helium temperature (4.2 K). For establishing a low temperature for the PL measurement, a cryostat for liquid helium or liquid nitrogen is used. Light which was used for excitation was a laser beam which was generated by a helium-cadmium (He—Cd) laser. Otherwise, the light for excitation may be either a laser or beam from an argon laser, a laser beam from a dye laser.

In the PL measurement, a laser beam is irradiated to a respective sample to excite the carriers, and the light emitting spectrum concurrent with transition of the carriers to the ground state is observed. The energy gap of the grown layer is known from the wavelength of the peak of the light emitting spectrum, and the Cd composition of the grown layer is known accordingly.

The Cd incorporating efficiency η into the grown layer is now defined by Equation 1.

$$\begin{aligned}\eta = {} & (\text{Cd composition ratio of the grown layer}) \,/ \\ & (\text{the ratio of the intensity of Cd molecular beams} \\ & \text{to the sum of the intensities of Zn molecular} \\ & \text{beams and Cd molecular beams actually} \\ & \text{irradiated to the substrate during the growth}) \\ = {} & |\text{Cd}\,/\,(\text{Zn}+\text{Cd})\,\text{<solid>}| \,/\, |\text{Cd}\,/\,(\text{Zn}+\text{Cd})\,\text{<beam>}| \quad (1)\end{aligned}$$

where the term Cd/(Zn+Cd)<solid> is the composition ratio of Cd in the grown layer, and the term Cd/(Zn+Cd)<beam> is the ratio of the intensity of Cd molecular beams to the sum of the intensities of Zn molecular beams and Cd molecular beams actually irradiated to the substrate during the growth.

Figure 4:
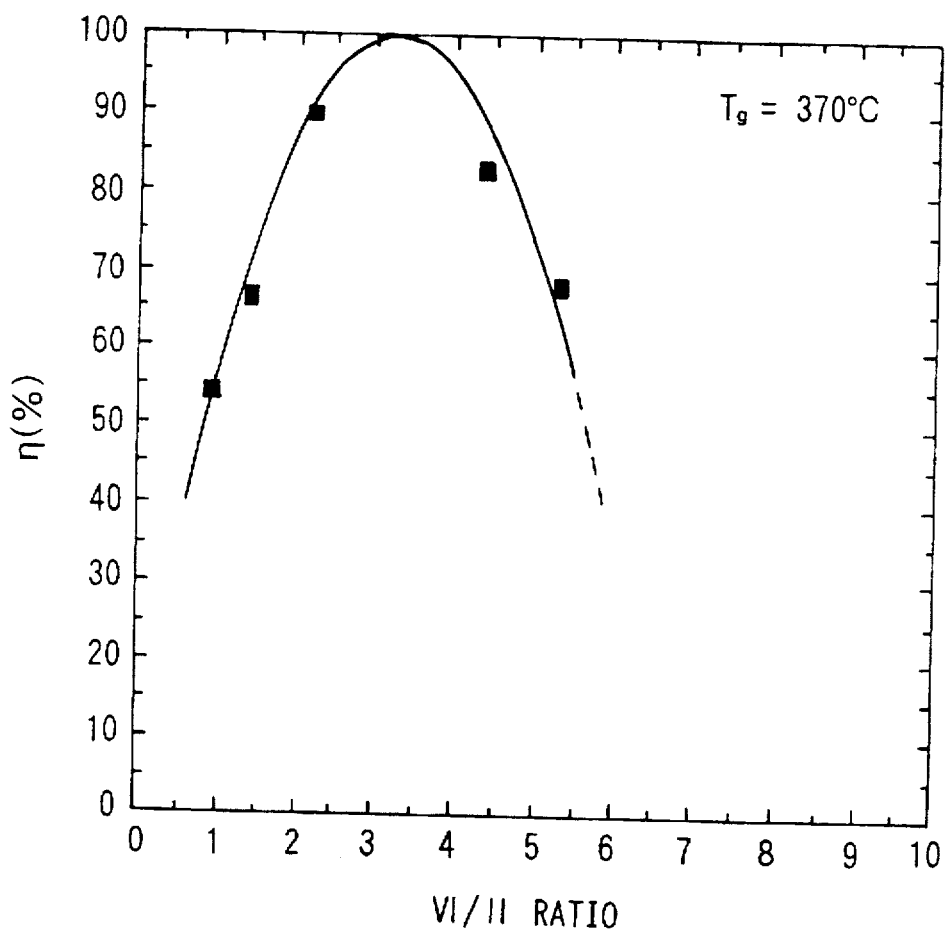
FIG. 4 is a graph showing the relation between the VI/II ratio and the Cd incorporating efficiency ri into a $Zn_{1-x}Cd_xSe$ active layer during its growth by the MBE method.

FIG. 4 shows the result of measurement of changes in Cd incorporating efficiency η with VI/II ratio during the growth of the $Zn_{1-x}Cd_xSe$ active layer 24, in which the VI/II ratio along the abscissa is expressed by:

$$\begin{aligned}\text{VI/II ratio} = {} & (\text{intensity of Se molecular beams})\,/ \\ & (\text{the intensity of Zn molecular beams plus} \\ & \text{the intensity of Cd molecular beams}) \quad (2)\end{aligned}$$

As shown in FIG. 4, the Cd incorporating efficiency x becomes the maximum value η=100% when the VI/II ratio equals 3.3, and becomes η<100% when the VI/II ratio is smaller and larger than 3.3. When the VI/II ratio is smaller than 3.3, group II elements, Cd and Zn, enter in the site of group II elements and combine with the group VI element Se. Since Zn couples with Se having dangling bonds on the surface of the crystal preferentially to Cd, η<100% is explainable. On the other hand, the reason of η<100% when the VI/II ratio is smaller than 3.3 has not been clarified, but is presumed to be the existence of Cd unconcerned with the growth.

However, the value of the VI/II ratio equal to 3.3 at which the Cd incorporating efficiency η is maximized varies with MBE apparatuses used. Essentially, therefore, for the reason explained below, η is maximized when the VI/II ratio in terms of intensities of molecular beams actually irradiated to the substrate, namely, the substantial or actual irradiated instensity VI/II ratio, equals 1.

Explained here is the reason why η is maximized when the substantial or actual VI/II ratio is 1.

According to a result of surface observation by a reflection high energy electron diffraction (RHEED) method, the surface rearranged structure of a ZnCdSe layer is a (2×1) structure when the layer is grown under the condition where the substantial or actual VI/II ratio is sufficiently larger than 1. However, the surface rearranged structure of a ZnCdSe layer is a c(2×2) structure when the layer is grown under the condition where the substantial or actual VI/II ratio is sufficiently smaller than 1. Thus, it is known that the surface rearranged structure of a ZnCdSe layer grown under the substantial or actual VI/II ratio around 1 has both the (2×1) structure and the c(2×2) structure. Actually with the $Zn_{1-x}Cd_xSe$ active layer 24 grown under the VI/II ratio near 3.3, its surface was observed by the RHEED method. As a result, the surface of the $Zn_{1-x}Cd_xSe$ active layer 24 had both the (2×1) structure and the (2×2) structure.

Figure 5:
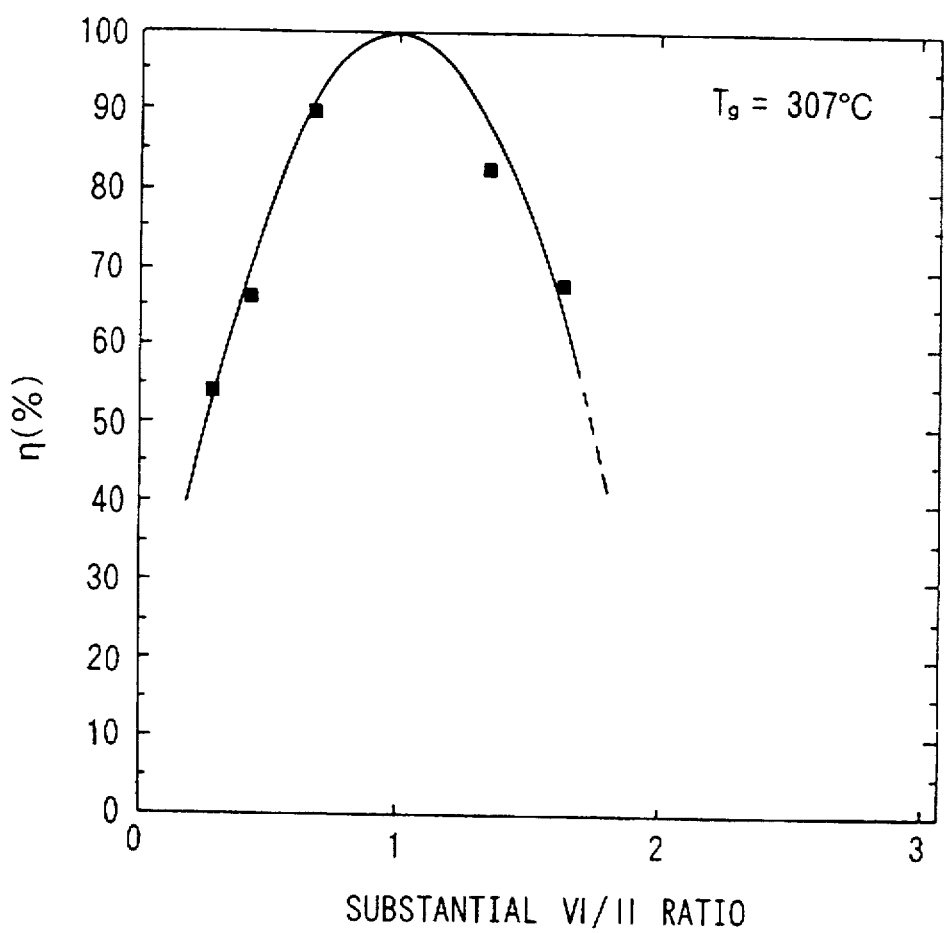
FIG. 5 is a graph showing the relation between the substantial VI/II ratio and the Cd incorporating efficiency $\eta$ into the $Zn_{1-x}Cd_xSe$ active layer during its growth by the MBE method.

It is known from the above reviews that the value 3.3 of the VI/II ratio in FIG. 4 corresponds to the value 1 of the substantial or actual VI/II ratio in terms of intensities of molecular beams actually irradiated to the substrate during the growth. FIG. 4 can be modified into FIG. 5 by placing the substantial VI/II ratio on the abscissa. As shown in FIG. 5, the Cd incorporating efficiency x becomes high enough for practical use when the actual or substantial VI/II ratio is in the range of 0.7 to 1.3. Further, the Cd incorporating efficiency η approaches to 100% when the actual or substantial VI/II ratio is in the range of 0.8 to 1.2. The Cd incorporating efficiency η takes the maximum value 100% when the actual or substantial VI/II ratio is 1.

Figure 6:
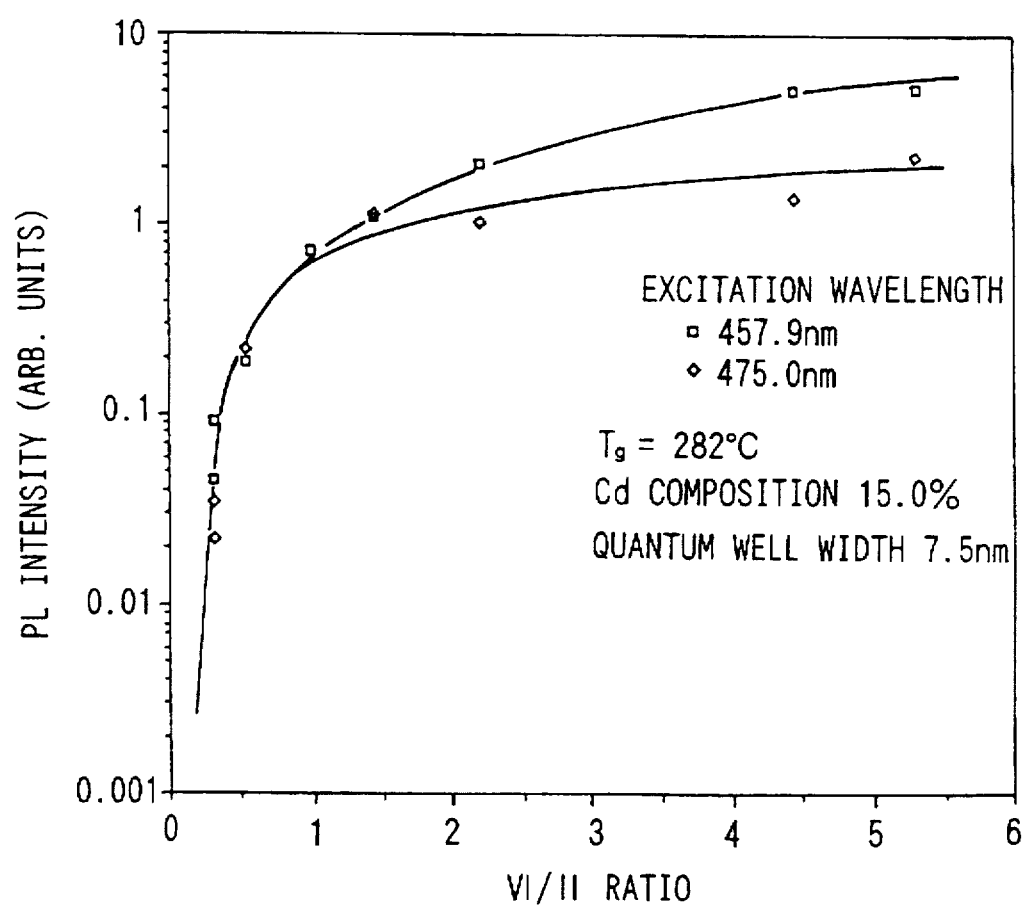
FIG. 6 is a graph showing the relation between the VI/II ratio during the growth of the $Zn_{1-x}Cd_xSe$ active layer and the photoluminescent intensity of the layer.

FIG. 6 shows changes in the intensity of the light emission spectrum (PL intensity) obtained by PL measurement with the VI/II ratio during the growth, with the PL intensity on the ordinate and the VI/II ratio on the abscissa. It is known from FIG. 6 that the PL intensity is low at and below the value 3.3 of the VI/II ratio corresponding to the value 1 of the actual or substantial VI/II ratio and that the layer saturates at a value of the VI/II ratio smaller than 3.3.

In view of the above facts, when the $Zn_{1-x}Cd_xSe$ active layer 24 is grown under a value of the actual or substantial VI/II ratio substantially equal to 1, the Cd incorporating efficiency x can be maximized, namely 100%, which promises a good crystallographic property of the $Zn_{1-x}Cd_xSe$ active layer 24.

Based on the above matters, an embodiment of the invention is explained. The embodiment is directed to fabrication of a semiconductor laser using a $Zn_{1-x}Cd_xSe$ active layer to which the invention is applied. The semiconductor laser has a so-called SCH (separate confinement heterostructure) structure.

Figure 7:
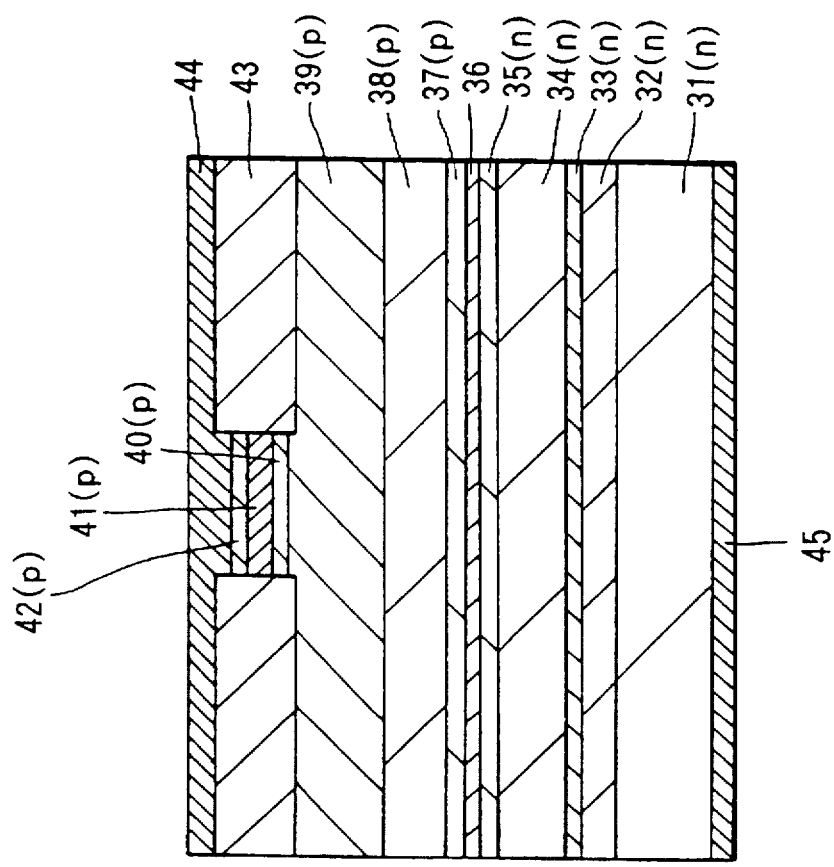
FIG. 7 is a cross-sectional view illustrating a method for fabricating a semiconductor laser according to an embodiment of the invention.

The method for fabricating a semiconductor laser according to the embodiment starts with the aspect shown in FIG. 7 where deposited on a (100)-oriented n-type GaAs substrate 31 doped with silicon (Si) as a donor impurity are an n-type GaAs buffer layer 32, an n-type ZnSe buffer layer 33, an n-type $Zn_{1-p}Mg_pS_qSe_{1-q}$ cladding layer 34 and an n-type $ZnS_ySe_{1-y}$ waveguide layer 35 in sequence by the MBE method. The n-type GaAs buffer layer 32 is doped with Si, for example, as a donor impurity. The n-type ZnSe buffer layer 33, n-type $Zn_{1-p}Mg_pS_qSe_{1-q}$ cladding layer 34 and n-type $ZnS_ySe_{1-y}$ waveguide layer 35 are doped with Cl, for example, as a donor impurity.

Then, the actual or substantial VI/II ratio is set to 1, and a $Zn_{1-x}Cd_xSe$ active layer 36 is grown on the n-type $ZnS_ySe_{1-y}$ waveguide layer 35 by the MBE method.

After that, sequentially grown on the $Zn_{1-x}Cd_xSe$ active layer 36 are a p-type $ZnS_ySe_{1-y}$ waveguide layer 37, a p-type $Zn_{1-p}Mg_pS_qSe_{1-q}$ cladding layer 38, a p-type $ZnS_vSe_{1-v}$ layer 39, a p-type ZnSe contact layer 40, a p-type ZnSe/ZnTe multiquantum well (MQW) layer 41 and a p-type ZnTe contact layer 42 by the MBE method. These p-type $ZnS_ySe_{1-y}$ waveguide layer 37, p-type $Zn_{1-p}Mg_pS_qSe_{1-q}$ cladding layer 38, p-type $ZnS_vSe_{1-v}$ layer 39, p-type ZnSe contact layer 40, p-type ZnSe/ZnTe multiquantum well (MQW) layer 41 and p-type ZnTe contact layer 42 are doped with N, for example, as an acceptor impurity.

Used for the growth of the n-type GaAs buffer layer 32 is another MBE apparatus (not shown) for growth of III-V compound semiconductors, which is different from the MBE apparatus for growth of the II-VI compound semiconductors shown in FIG. 1. After the n-type GaAs buffer layer 32 is grown by using the MBE apparatus for growth of III-V compound semiconductors, the n-type GaAs substrate 31 is transferred in vacuum from the growth chamber of the MBE apparatus for III-V compound semiconductors to the growth chamber 1 of the MBE apparatus for II-VI compound semiconductors. Then, the II-VI compound semiconductor layers are grown in the growth chamber 1 as mentioned above. This time, also the cell for generating Mg molecular beams and the cell for generating Te molecular beams are used in addition to the cells 4 to 8.

After that, a stripe-shaped resist pattern (not shown) is formed on the p-type ZnTe contact layer 42. Using the resist pattern as a mask, the product is etched by a wet etching method up to the depth to reach midway of the p-type $ZnS_ySe_{1-y}$ layer 39. As a result, the upper layer portion of the p-type $ZnS_ySe_{1-y}$ layer 39, p-type ZnSe contact layer 40, p-type ZnSe/ZnTe MQW layer 41 and p-type ZnTe contact layer 42 are patterned into the form of a stripe.

While maintaining the resist pattern used for the prior etching and after an $Al_2O_3$ film, for example, is deposited on the entire surface by vacuum evaporation, the resist pattern and the overlying $Al_2O_3$ film are removed together (lift-off). As a result, an insulating layer 43 in form of the $Al_2O_3$ film is formed on a selective portion of the p-type $ZnS_ySe_{1-y}$ layer 39 other than the stripe portion.

After that, a palladium (Pd) film, platinum (Pt) film and gold (Au) film, for example, are deposited sequentially by vacuum evaporation on the entire surface of the stripe-shaped p-type ZnTe contact layer 42 and the insulating layer 43 to make a p-side electrode 44 in form of the Pd/Pt/Au electrode. The product is then annealed, if required, to bring the p-side electrode 44 into ohmic contact with the p-type ZnTe contact layer 42. Formed on the rear surface of the n-type GaAs substrate 21 is an n-side electrode 45, such as In electrode, in ohmic contact with the substrate.

After these steps, an expected semiconductor laser is completed.

According to the embodiment described above, since the substantial VI/II ratio is set around 1 during epitaxial growth of the $Zn_{1-x}Cd_xSe$ active layer 36 by the MBE method, the Cd incorporating efficiency η into the grown layer can be increased to 100% approximately. Therefore, the $Zn_{1-x}Cd_xSe$ active layer 26 having a good crystallographic property can be obtained, and a high performance semiconductor laser having a high light emitting efficiency, a low threshold current density and a good current-voltage characteristic and capable of emitting blue to green light can be realized.

Having described a specific preferred embodiment of the present invention with reference to the accompanying drawings, it is to be understood that the invention is not limited to that precise embodiment, and that various changes and modifications may be effected therein by one skilled in the art without departing from the scope or the spirit of the invention as defined in the appended claims.

For example, although the embodiment has been described as applying the invention to fabrication of a semiconductor laser having a SCH structure, the invention may also be applied to fabrication of a semiconductor laser having a DH structure (double heterostructure) or fabrication of a light emitting diode. Furthermore, the invention may be applied to fabrication of any other semiconductor devices other than semiconductor light emitting devices using a II-VI compound semiconductor layer containing Cd.

As described above, the present invention can promise a sufficiently high cadmium incorporating efficiency into a grown layer and promises a cadmium-containing II-VI semiconductor layer having a good crystallographic property by growing a cadmium-containing II-VI compound semiconductor layer while setting the ratio of the substantial intensity of molecular beams of a group VI element to the substantial intensity of molecular beams of a group II element in the range from 0.7 to 1.3, namely by optimizing the substantial VI/II ratio during the growth.

What is claimed is:

1. A method for growing II-VI mixed crystal compound semiconductor layer containing cadmium on a surface by using a molecular beam epitaxy method for higher cadmium incorporating efficiency, comprising:

setting a ratio of an actual intensity of the molecular beams of a group VI element irradiated on the surface to an actual intensity of molecular beams of a group II element irradiated on the surface to be in a range from 0.7 to 1.3 during the growth such that the cadmium containing II-VI compound semiconductor layer is a mixed crystal layer having (2×1) structure and c(2×2) structure.

2. The method for growing a II-VI compound semiconductor layer containing cadmium according to claim 1, wherein said II-VI compound semiconductor layer containing cadmium is (100)-oriented.

3. The method for growing a II-VI compound semiconductor layer containing cadmium according to claim 1, wherein said II-VI compound semiconductor layer containing cadmium is a ZnCdSe layer, ZnCdS layer, CdMgSe layer or ZnCdSSe layer.

4. A method for fabricating a semiconductor laser comprising a II-VI mixed crystal compound semiconductor layer containing cadmium in which the II-VI compound semiconductor layer containing cadmium is grown on a surface by using a molecular beam epitaxy method for higher cadmium incorporating efficiency, comprising:

setting a ratio of an actual intensity of a molecular beams of group VI elements irradiated on the surface to an actual intensity of molecular beams of group II elements irradiated on the surface to be in a range from 0.7 to 1.3 such that the cadmium containing II-VI compound semiconductor layer is a mixed crystal layer having (2×1) structure and c(2×2) structure.

5. The method for fabricating a semiconductor laser comprising a II-VI compound semiconductor layer containing cadmium according to claim 4, wherein said II-VI compound semiconductor layer containing cadmium is a ZnCdSe layer, ZnCdS layer, CdMgSe layer or ZnCdSSe layer.

6. The method for fabricating a semiconductor laser comprising a II-VI compound semiconductor layer containing cadmium according to claim 4, wherein said II-VI compound semiconductor layer containing cadmium is an active layer of the semiconductor laser.

7. A method according to claim 1, wherein the step of setting a ratio sets the ratio in a range of 0.8 to 1.2.

8. A method according to claim 1, wherein the step of setting a ratio sets the ratio at 1.

9. A method for growing II-VI mixed crystal compound semiconductor layers containing cadmium on a surface with a high cadmium incorporating efficiency comprising the step of:

providing a molecular beam epitaxy apparatus having molecular beam sources for the cadmium, at least one additional group II element and at least one group VI element;

adjusting intensities of each of the molecular beam sources to create a ratio of the actual intensity of the molecular beams of group VI elements irradiated on the surface to the actual intensity of the molecular beams of the group II elements irradiated on the surface to be in a range of 0.7 to 1.3 such that the cadmium containing II-VI compound semiconductor layer is a mixed crystal layer having (2×1) structure and c(2×2) structure.

10. A method according to claim 9, wherein the step of adjusting creates the ratio in a range of 0.8 to 1.2.

11. A method according to claim 9, wherein the step of adjusting creates the ratio at 1.

12. A method according to claim 9, wherein the semiconductor layer is selected from a group consisting of ZnCdSe, ZnCdS, CdMgSe and ZnCdSSe.

* * * * *